(12) United States Patent
Cheng et al.

(10) Patent No.: US 7,335,607 B2
(45) Date of Patent: Feb. 26, 2008

(54) METHOD OF FORMING A GATE DIELECTRIC LAYER

(75) Inventors: Po-Lun Cheng, Kaohsiung County (TW); Li-Wei Cheng, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/307,043

(22) Filed: Jan. 20, 2006

(65) Prior Publication Data

US 2006/0228907 A1 Oct. 12, 2006

Related U.S. Application Data

(62) Division of application No. 10/907,560, filed on Apr. 6, 2005, now abandoned.

(51) Int. Cl.
*H01L 21/31* (2006.01)

(52) U.S. Cl. .............................. 438/778; 257/E21.675
(58) Field of Classification Search ................ 438/778; 257/E21.675, E21.686, E21.688
See application file for complete search history.

(56) References Cited

U.S. PATENT DOCUMENTS 6,171,978 B1 * 1/2001 Lin et al. ..................... 438/775
6,291,867 B1 * 9/2001 Wallace et al. ............. 257/410

* cited by examiner

*Primary Examiner*—Thao P. Le
(74) *Attorney, Agent, or Firm*—Jianq Chyun IP Office (57) ABSTRACT

A method of forming a gate dielectric is described. A plasma treatment process is performed to form a dielectric structure on a substrate, wherein the dielectric structure having a graded dielectric constant value that decreases gradually in a direction toward the substrate.

19 Claims, 7 Drawing Sheets

METHOD OF FORMING A GATE DIELECTRIC LAYER

CROSS-REFERENCE TO RELATED APPLICATION

This is a divisional application of application Ser. No. 10/907,560, filed on Apr. 6, 2005, which is now pending and all disclosures of the application are incorporated herewith by reference.

BACKGROUND OF THE INVENTION

1. Field of the Invention

The present invention generally relates to a fabrication process of semiconductors. More particularly, the present invention relates to a fabrication method of a gate dielectric layer and.

2. Description of Related Art

Along with the rapid development in the Ultra-Large Scale Integration (ULSI) industry in recent years, circuit design is directed to a continuously reducing the size of devices. In order to increase the level of integration and the driving capacity, the line width of the gate is shorten and the thickness of gate dielectric layer is minimized correspondingly. In particular, as the semiconductor industry enters the era of deep submicron, the thickness of a gate dielectric layer is reduced from a couple hundred Å to about 40 Å. The fabrication of the gate dielectric layer in the ultra-Large Scale Integration (ULSI) technology is always an important matter. To produce an ultra thin gate dielectric layer with high quality while the process window is being reduced is an imminent problem to be resolved.

Applying thermal oxidation to fabricate a silicon oxide layer as a gate dielectric layer is well known in the art. However, pin holes are always present inside the structure of the silicon oxide layer leading to problems, such as the direct-tunnelling current . . . etc. Therefore, the aforementioned approach can not be used to form a thin gate dielectric layer. Other fabrication method known in the art includes performing a nitration treatment by introducing silicon nitride into a gate dielectric layer, which mainly contains silicon dioxide, to form a nitride oxide (NO) layer. The nitride oxide layer can reduce the leakage current and improve the reliability of the process. However, there are other problems existed with a stacked nitride oxide layer, formed with a silicon oxide layer and a nitride silicon layer, serving as a gate dielectric layer. For example, nitrogen atoms can easily diffuse through the interface between the silicon substrate and the silicon oxide layer during the nitration process to affect the efficiency and the stability of the devices. Besides, the interface between the silicon oxide layer and the silicon nitride layer can easily reduce the density of the trapped charges. Therefore, the efficiency and the stability of the devices are affected together with the reliability of the fabrication process.

SUMMARY OF THE INVENTION

Broadly speaking, the present invention is directed to a fabricating method for a gate dielectric layer, wherein the interface characteristics between the gate dielectric layer and the substrate, and the between the internal layers of the stacked gate dielectric layer are improved to improve the film layer qualities of the gate dielectric layer.

In accordance with one aspect of the present invention, a fabrication method for a gate is provided to improve the stability of the devices and the reliability of the fabrication method.

In accordance with another aspect of the present invention, a gate dielectric layer is provided to improve the quality of the dielectric layer and the liability of the fabrication method.

In accordance with yet another aspect of the present invention, a gate is provided to improve the stability of the devices and the reliability of the fabrication method.

The present invention provides a fabrication method for a gate dielectric layer, and the method includes performing a plasma process on the substrate to form a dielectric layer thereon, wherein the dielectric layer has a graded dielectric constant value that decreases towards the substrate.

According to an embodiment of the present invention, the above mentioned method further includes performing a thermal treatment process on the substrate after the plasma process.

According to an embodiment of the present invention, the above mentioned graded dielectric constant is between 3.9~7.

According to an embodiment of the present invention, the above mentioned plasma process is operated at about 400° C.

According to an embodiment of the present invention, the above mentioned plasma process includes performing an oxygen-containing plasma process followed by a nitrogen-containing plasma process. Furthermore, the plasma process is conducted by adjusting the flow rate ratio of the reacting gas of the oxygen-containing plasma treatment process and the nitrogen-containing plasma treatment process to have the flow rate ratio increases from low to high. The above mentioned flow ratio for the reacting gas is between 0~∞.

According to an embodiment of the present invention, the above mentioned plasma process is operated under a temperature of about 400° C.

According to an embodiment of the present invention, the surface of the above mentioned dielectric structure in contact with the substrate contains a higher concentration of the oxygen atoms than the nitrogen atoms.

According to and embodiment of the present invention, the top surface of the above mentioned dielectric layer contains a higher concentration of the nitrogen atoms than the oxygen atoms.

The present invention provides another fabrication method for a gate, and the method includes performing a plasma process on the substrate to form a dielectric layer thereon, wherein the dielectric layer has a graded dielectric constant value that decreases towards the substrate. The following process includes forming a conducting layer, and then defining the conducting layer structure to form a stacked gate structure.

According to an embodiment of the present invention, the above mentioned method further includes performing a thermal process after the plasma treatment process.

According to an embodiment of the present invention, the above mentioned graded dielectric constant is between 3.9~7.

According to an embodiment of the present invention, the above mentioned plasma treatment process is initially conducted with an oxygen-containing plasma process, follow by a nitrogen-containing plasma process. Furthermore, the plasma treatment process is conducted by the adjusting the flow rate ratio of the reacting gases of the oxygen plasma treatment process and the nitrogen plasma treatment process to have the flow rate ratio to increase from low to high. The above mentioned flow rate ratio for the reacting gases is between 0~∞.

According to an embodiment of the present invention, the above mentioned plasma process is conducted under a temperature of about 400° C.

According to an embodiment of the present invention, the contact surface between the above mentioned dielectric structure and the substrate contains a higher concentration of the oxygen atoms than the nitrogen atoms.

According to an embodiment of the present invention, the top surface of the above mentioned dielectric layer contains a higher concentration of the nitrogen atoms than the oxygen atoms.

According to an embodiment of the present invention, the above mentioned conducting layer is a polysilicon layer.

The present invention again provides another gate dielectric layer having a dielectric layer with a graded dielectric constant value that decreases towards the substrate.

According to an embodiment of the present invention, the above mentioned graded dielectric constant is between 3.9~7.

According to an embodiment of the present invention, the surface of the above mentioned dielectric layer in contact with the substrate can be silicon oxide.

According to an embodiment of the present invention, the top surface of the above mentioned dielectric layer can be silicon nitride.

The present invention further provides another gate, which includes a substrate, a dielectric layer and a conducting layer. The dielectric layer has a graded dielectric constant value that decreases towards the substrate, and the conducting layer is disposed on the dielectric layer.

According to an embodiment of the present invention, the above mentioned graded dielectric constant is between 3.9~7.

According to an embodiment of the present invention, the above mentioned conducting layer is polysilicon.

According to an embodiment of the present invention, the surface of above mentioned dielectric layer in contact with the substrate can be silicon oxide.

According to an embodiment of the present invention, the top surface of the above mentioned dielectric layer can be silicon nitride.

The present invention applies a plasma treatment process on the substrate to form a dielectric layer structure, wherein the quality of the interface between the dielectric structure and the substrate is desirable. Further, the quality of the internal film layer of the dielectric layer structure can be improved, in addition to improving the reliability of the fabrication process. Besides, the above mentioned plasma treatment process can be performed at a low temperature. No damages to the surface of the substrate will occur. Furthermore, the plasma treatment process includes an adjustment of the flow rate ratio of the reacting gases of the oxygen-containing plasma process and the nitrogen-containing plasma process, which can be conducted in the same operation chamber to concurrently save the queue-time and the fabrication cost.

Several exemplary embodiments of the invention will now be described in detail with reference to the accompanying drawings. It is to be understood that the foregoing general description and the following detailed description of preferred purposes, features, and merits are exemplary and explanatory towards the principles of the invention only and are not restrictive of the invention, as claimed.

DESCRIPTION OF THE EMBODIMENTS

Figure 1A:
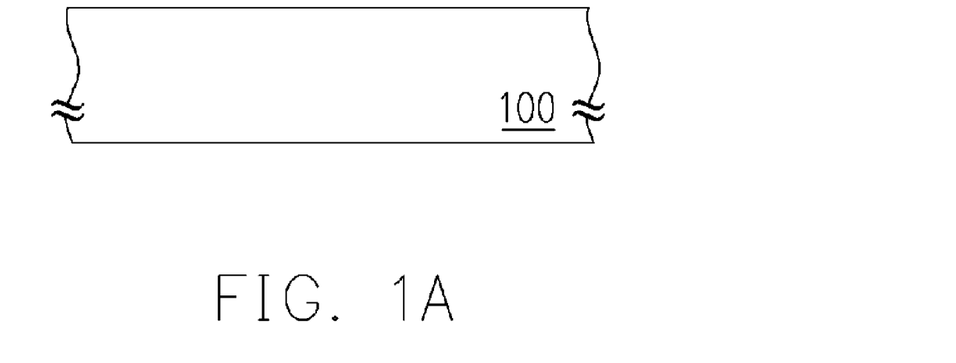
FIG. 1A through 1C are schematic, cross sectional views showing the steps for fabricating a gate dielectric structure in accordance with one embodiment of the invention.
Figure 1B:
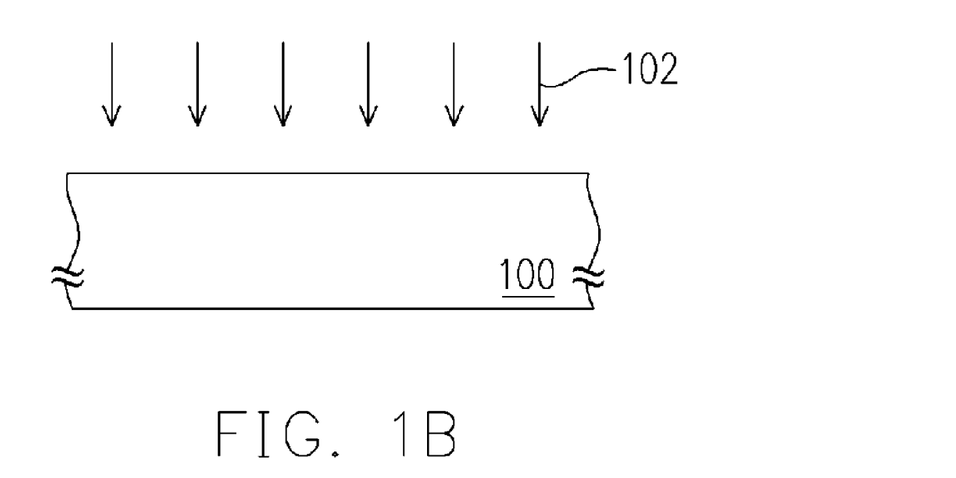
Figure 1C:
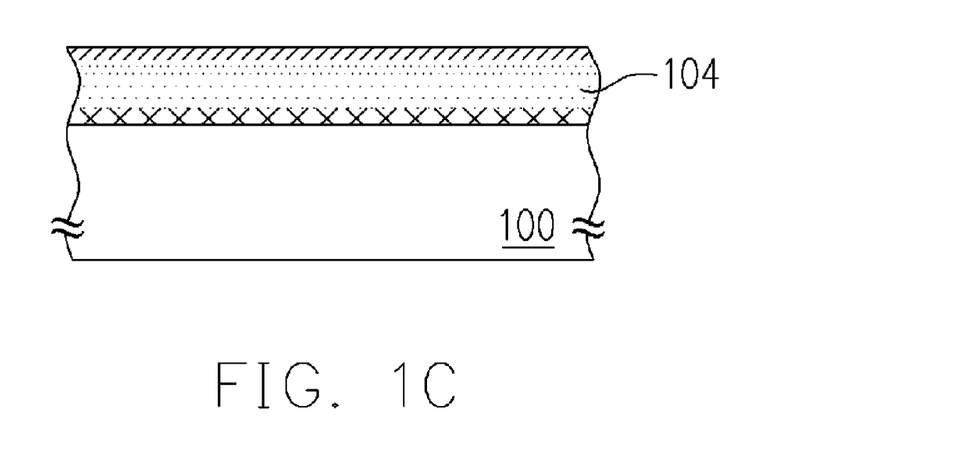

FIG. 1A through 1C are schematic, cross-sectional views showing the steps for fabricating the gate dielectric structure in accordance with one embodiment of the invention.

Turning to FIG. 1A, a substrate 100 is provided, wherein the substrate 100 can be a silicon substrate.

Thereafter, referring next to FIG. 1B, a plasma treatment process 102 is performed on the substrate 100. The previously mentioned plasma process 102 is a low temperature operation, wherein the operational temperature is, for example, about 400° C. The plasma treatment process 102 includes performing an oxygen-containing plasma, followed by a nitrogen-containing plasma. The reacting gas for the oxygen-containing plasma is oxygen; therefore, the substrate is being subjected to an oxidation reaction to grow a silicon oxide layer. In addition, the reacting gas for the nitrogen-containing plasma is, and the mechanism of the nitrogen plasma allows the nitrogen atoms to enter silicon oxide for further reaction.

In particular, the whole plasma treatment process 102 can be implemented under a low temperature; therefore no damages will be induced on the surface of the film layer on the substrate 100.

Besides, the above mentioned plasma treatment process 102 is adjusting the flow rate ratio of the reacting gases of the oxygen-containing plasma process and the nitrogen-containing plasma process from a low value to a high value. The above mentioned flow rate ratio for the reacting gases $(N_2/O_2)$ is between 0~∞. In one embodiment of the present invention, plasma treatment process 102 can be conducted in the same operation chamber for both the oxygen-containing plasma process and the nitrogen-containing plasma process to minimize the queue-time.

In another embodiment of the present invention, a thermal process can be conducted on the substrate 100 after the plasma processes 102, wherein the thermal process can be, for example, an annealing process to refine the pre-formed film layer and to enhance the quality of the layer.

Thereafter, continuing to FIG. 1C, a dielectric layer structure 104 is formed on the substrate 100 after the plasma process 102. Since the reacting gas for the plasma process 102 are nitrogen and oxygen and the flow rate ratio of the reacting gases $(N_2/O_2)$ in the plasma treatment process is adjusted to increase gradually, the surface of the dielectric layer structure 104 in contact with the substrate 100 has an oxygen atom concentration higher than the nitrogen atom concentration, while the top surface of dielectric layer structure 104 has a nitrogen atom concentration higher than the oxygen atom concentration. Accordingly, the dielectric layer structure 104 comprises, sequentially from the substrate 100, silicon oxide, an oxygen-rich silicon oxynitride, a nitrogen-rich silicon oxynitride (silicon oxynitride with a higher concentration of nitrogen), and silicon nitride. In this manner, the dielectric layer structure 104 has a graded dielectric constant value that decreases towards the substrate, and the graded dielectric constant value is between 3.9~7.

According to the above description, the material of the dielectric layer structure 104 that is adjacent to the substrate 100 is silicon oxide, which has better interface characteristics. The defects problems at the interface between the gate dielectric layer 104 and the substrate 100 can be resolved. In addition, the dielectric layer structure 104 can prevent any defects at the interface inside the dielectric layer structure (silicon oxide layer and silicon nitride layer) as often occurred in the prior art. In addition, the internal part of the dielectric layer structure 104 has a higher nitrogen content; therefore, the dielectric constant is higher.

Figure 2A:
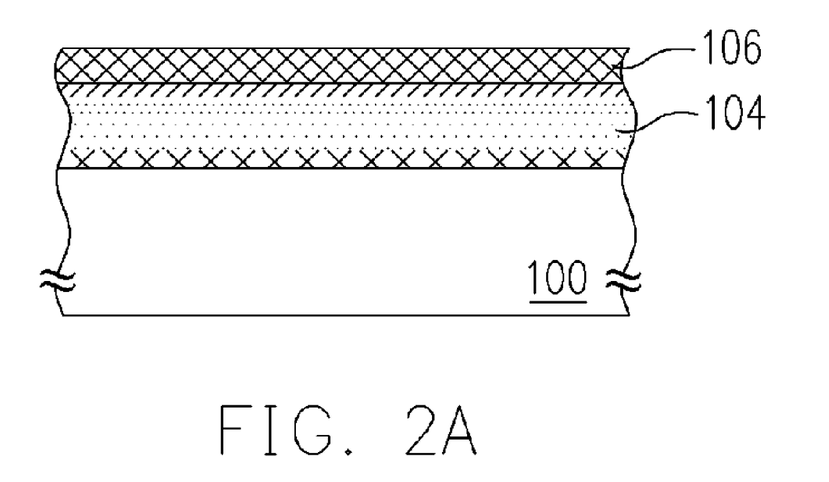
FIG. 2A and FIG. 2B are schematic, cross sectional views showing the steps for fabricating a gate according to one embodiment of the invention.
Figure 2B:
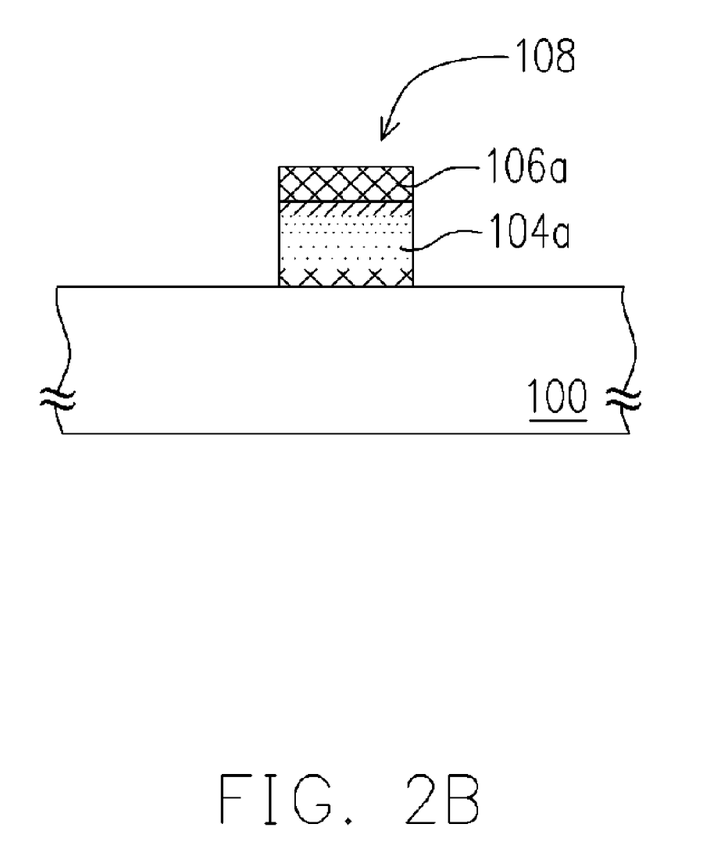

FIG. 2A and FIG. 2B are schematic, cross sectional views showing the steps for fabricating a gate according to one embodiment of the invention, where FIG. 2A is a continuation of the above embodiment of FIG. 1C and the same reference numbers will be used for like parts in FIG. 2A to FIG. 2B.

As shown in FIG. 2A, a conducting layer 106 is formed on the dielectric layer structure. The material of the conducting layer 106 can be, for example, polysilicon, which is formed by, for example, chemical vapour deposition.

With reference to FIG. 2B, a gate stacked structure 108 is formed by defining the conducting layer 106 and the dielectric layer structure 104, and the gate stacked structure 108 is the gate. The method for defining the conducting layer 106 and the dielectric layer structure 104 is, for example, an etching process.

In addition, the above mentioned structure for the gate is comprised of a dielectric layer structure 104a and a conducting layer 106a. The dielectric layer structure 104a is disposed on the substrate 100, and the dielectric layer structure 104a has a graded dielectric constant value that decreases towards the substrate 100. The conducting layer 106a is disposed on the dielectric layer structure 104a. The surface of the dielectric layer structure 104a in contact with the substrate 100 can be silicon oxide and the material of the surface of the dielectric layer structure 104a in contact with the conducting layer 106a can be silicon nitride.

According to above description, the dielectric structure 104 as the gate dielectric layer for the gate serves to decrease the equivalent oxide thickness (EOT) and avoid the degradation of the gate dielectric layer and an electrical breakdown. Furthermore, the reliability of the process is improved.

FIG. 3 to FIG. 8 are diagrams illustrating the tests data on the semi-conductive devices fabricated according to the fabrication method of the gate dielectric layer of the invention.

Figure 3:
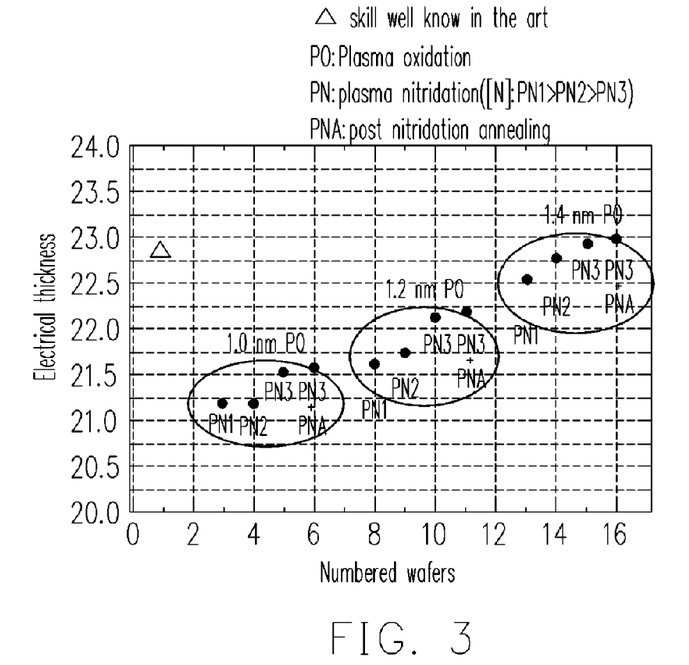
FIG. 3 is a diagram illustrating the relationship between the electrical thickness and the wafers that are being subjected to the various treatments.

Turning to the FIG. 3, FIG. 3 is a diagram illustrating the relationship between the electrical thickness and the wafers that are being subjected to the various treatments. The test objects (wafer numbers: 3, 4, 5, 6, 8, 9, 10, 11, 13, 14, 15 and 16) in the diagram are being subjected to the oxygen-containing plasma process, and three different groups of physical test values (10, 1.2, 1.4 nm) are obtained. Thereafter, each group of the test objects is subjected to the nitrogen-containing plasma process after the oxygen-containing plasma process, where [N] represents the concentration of nitrogen used in the nitrogen-containing plasma process. PN1 depicts the highest nitrogen concentration, PN2 depicts the second highest nitrogen concentration and PN3 depicts the lowest nitrogen concentration. Furthermore, a post nitridation annealing (PNA) is being conducted on the wafers that are treated with the lowest concentration of nitrogen of each group. Wafer 1 fabricated by the conventional method for a semiconductor device has an electrical thickness of about 23.0.

According to FIG. 3, the lower the nitrogen concentration applied to the nitrogen-containing plasma process, the higher the electrical thickness is being detected. The electrical thickness is the highest if the test objects are further being subjected to the annealing process after the nitrogen-containing plasma treatment process. In addition, using the semi-conductive device made from the conventional fabrication method as the baseline measurement of the electrical thickness (baseline Y=23.0), the test objects made according to the method of the present invention. The common finding is that the test objects made according to the method of the present invention all have an electrical thickness value smaller than 0.23. Therefore, according to the present invention, the equivalent oxide thickness (EOT) is reduced.

Figure 4:
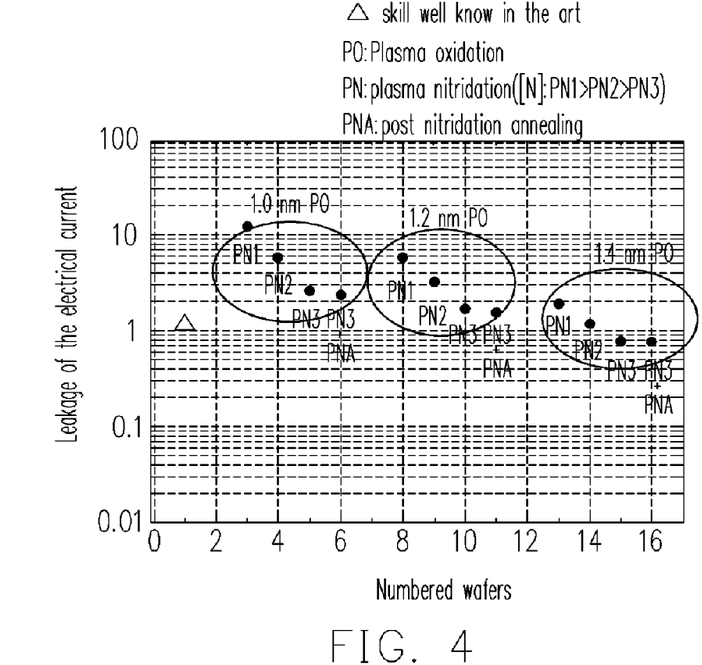
FIG. 4 is a diagram illustrating the relationship between the leakage current and the wafers that are being subjected to the various treatments.

Referring to FIG. 4, FIG. 4 is a diagram illustrating the relationship between the leakage current and the wafers that are being subjected to the various treatments. According to FIG. 4, the lower the concentration of the nitrogen being supplied to the nitrogen-containing plasma process, the smaller the leakage current. The leakage current is the lowest if the test objects are further subjected to an annealing process. In addition, using the semi-conductive device made from the conventional fabrication method as the baseline value of the leakage current (baseline Y=1), the test objects made according to the method of the present invention are compared. The common finding is that the testing objects made according to the method of the present invention are all received leakage current value greater than 1. Therefore, the present invention is effectively improved the phenomenon of leakage current.

Figure 5:
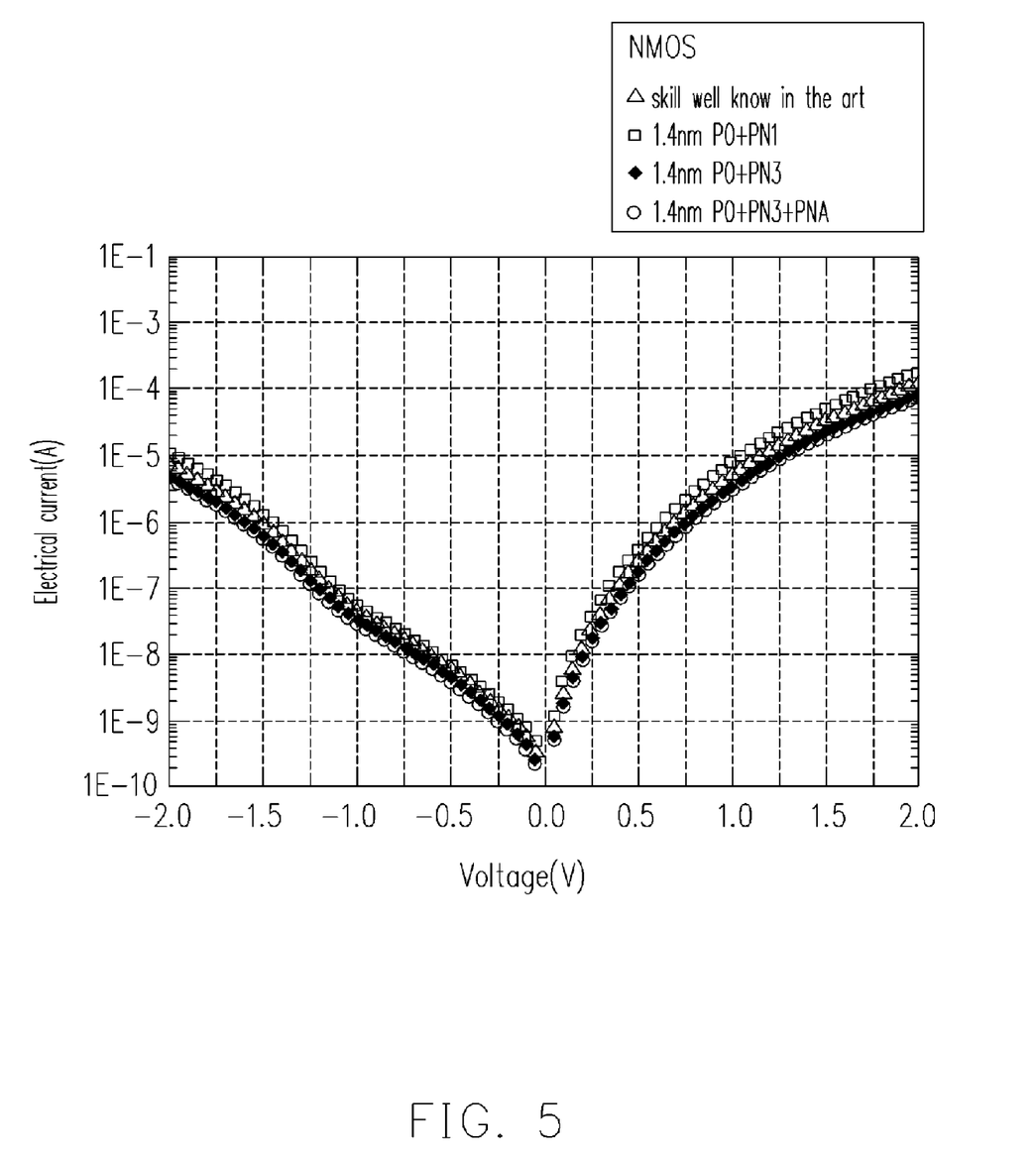
FIG. 5 and FIG. 6 are diagrams illustrating the electrical current vs. voltage relationship of an N type transistor and a P type transistor, respectively, fabricated in. in accordance with the embodiments of the invention.
Figure 6:
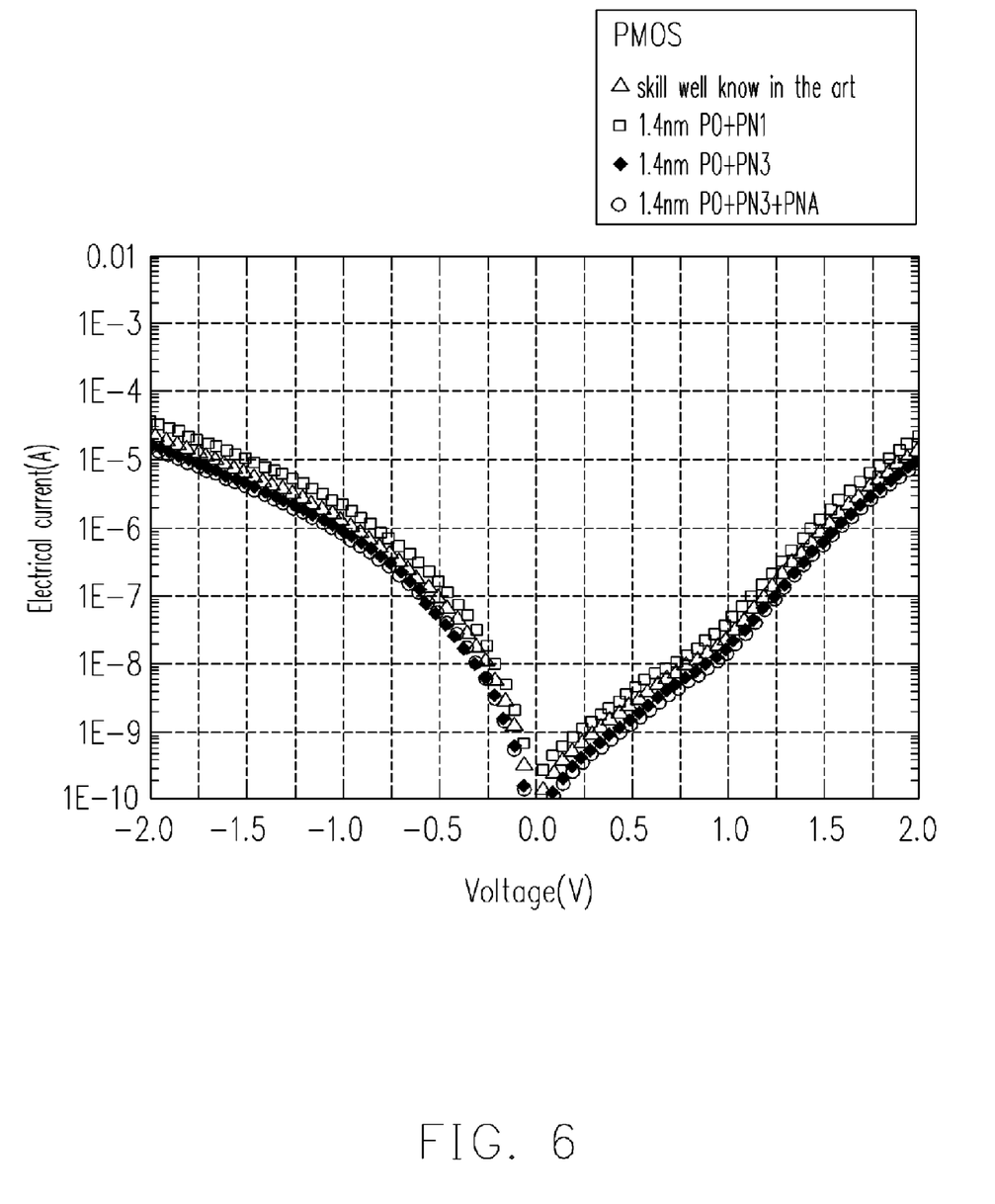

Turning to FIG. 5 and FIG. 6, FIG. 5 and FIG. 6 are diagrams respectively illustrating the electrical current vs. voltage relationship of an N type transistor and a P type transistor fabricated in accordance with the embodiments of the invention. The transistor devices in the FIG. 5 and FIG. 6 are fabricated with both the conventional method and methods of the present invention (PO+PN, PO+PN3, PO+PN3+PNA). The test outcomes confirm that the semiconductor devices formed by the conventional method and by the methods of the present invention show similar behaviours in the electrical current vs. voltage relationship. These findings prove that the electrical characteristics of the semiconductor device formed according to the present invention are not inferior to those formed by the conventional method.

Figure 7:
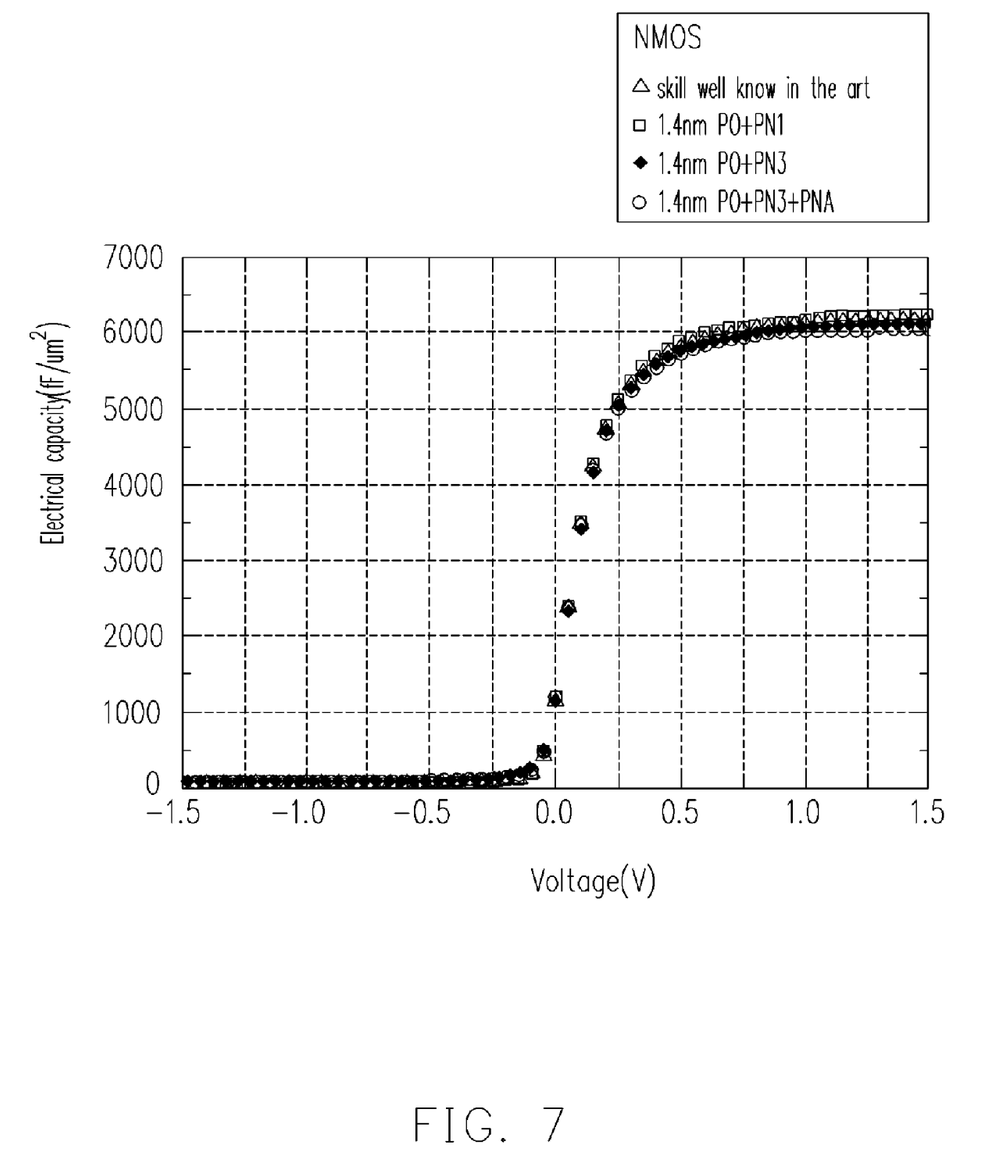
FIG. 7 and FIG. 8 are diagrams respectively illustrating the capacitance vs. voltage relationship of an N type transistor and a P type transistor fabricated in accordance with the embodiments of the invention.
Figure 8:
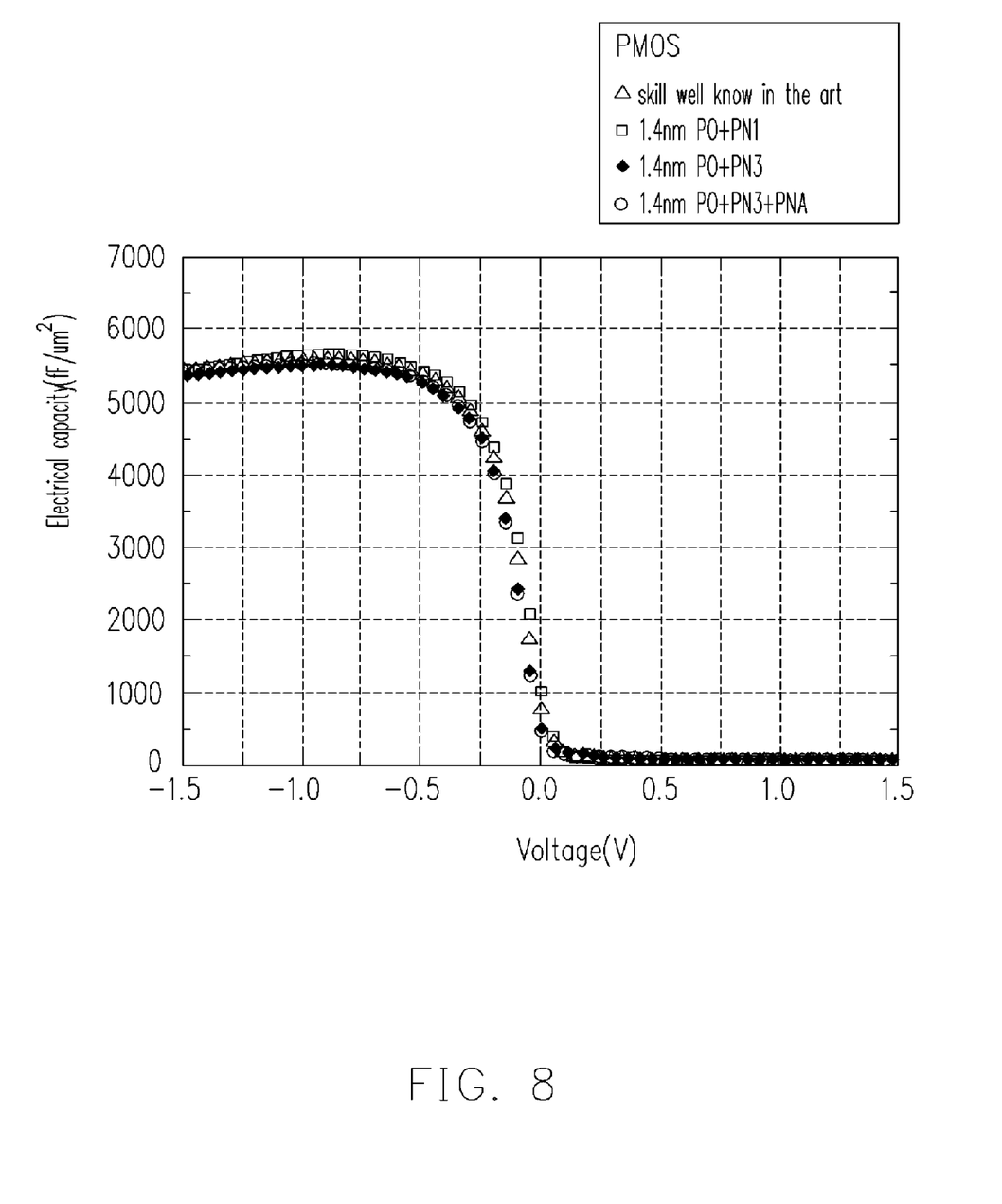

Referring next to the FIG. 7 and FIG. 8, FIG. 7 and FIG. 8 are diagrams respectively illustrating the capacitance vs. voltage relationship of an N type transistor and a P type transistor fabricated in accordance with the embodiments of the invention. Similarly, the test outcomes confirm that the semiconductor devices formed by the conventional method and by the methods of the present invention show similar behaviours in the electrical current vs. voltage relationship.

These finding prove the semiconductor device formed according to the present invention also has excellent electrical characteristics.

According to the above-mentioned description, the present invention can effectively reduce the equivalent oxide thickness. Further, the problem of leakage current of a device can be improved.

Accordingly, the present invention provides at least the following advantages.

1. The present invention effectively reduces the equivalent oxide thickness (EOT) of the gate dielectric layer without affecting the electrical characteristics of the device.

2. The plasma processes of the present invention will not damage the surface of the film layers and can be conducted in the same reaction chamber to reduce the queue-time and production cost.

3. The present invention improves the interface characteristics between the gate dielectric layer and the substrate, and the interface characteristics inside the film layers; therefore, the reliability of the process is also improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a gate dielectric layer, comprising:
performing a plasma treatment process on a substrate to directly form a dielectric layer on the substrate, wherein the dielectric layer contains a graded dielectric constant value that decreases towards the substrate, a bottom surface of the dielectric layer in contact with the substrate is silicon oxide and a top surface of the dielectric layer is silicon nitride, and reacting gases used in the plasma treatment process are $N_2/O_2$.

2. The method as recited in claim 1 further comprising conducting a thermal treatment process after the plasma process.

3. The method as recited in claim 1, wherein the graded dielectric constant value is between 3.9~7.

4. The method as recited in claim 1, wherein performing the plasma treatment process further comprises:
conducting an oxygen-containing plasma, and
conducting a nitrogen-containing plasma subsequently.

5. The method as recited in claim 4, wherein the plasma process further comprises adjusting a flow rate ratio of reacting gases ($N_2/O_2$) in the plasma treatment process to have the flow rate ratio increases gradually.

6. The method as recited in claim 5, wherein the flow rate ratio ($N_2/O_2$) of the reacting gases is between 0~∞.

7. The method as recited in claim 1, wherein an operating temperature for the plasma treatment process is around 400° C.

8. The method as recited in claim 1, wherein a surface of the dielectric layer that is in contact with the substrate comprises a higher concentration of oxygen atoms than the nitrogen atoms.

9. The method as recited in claim 1, wherein atop surface of the dielectric layer comprises a higher concentration of nitrogen atoms than oxygen atoms.

10. A fabrication method of a gate, the method comprising,
conducting a plasma treatment process to a substrate to directly form a dielectric layer structure on the substrate, wherein the dielectric layer structure has a graded dielectric constant value that decreases towards the substrate, a bottom surface of the dielectric layer in contact with the substrate is silicon oxide and a top surface of the dielectric layer is silicon nitride, and reacting gases used in the plasma treatment process are $N_2/O_2$.

11. The method as recited in claim 10, further comprising performing a thermal treatment process after the plasma process.

12. The method as recited in claim 10, wherein the graded dielectric constant value is between 3.9~7.

13. The method as recited in claim 10, wherein conducting the plasma process comprises:
conducting an oxygen-containing plasma; and
conducting a nitrogen-containing plasma subsequently.

14. The method as recited in claim 13, wherein the plasma treatment process Thither comprises adjusting a flow rate ratio ($N_2/O_2$) of reacting gases in the plasma treatment process to have the flow rate ratio increases gradually.

15. The method as recited in claim 14, wherein the reacting gas rate ratio ($N_2/O_2$) for the plasma process is between 0~∞.

16. The method as recited in claim 10, wherein the plasma process is operated under a temperature of about 400° C.

17. The method as recited in claim 10, wherein a surface of the dielectric layer structure that is in contact with the substrate comprises a higher concentration of oxygen atoms than nitrogen atoms.

18. The method as recited in claim 10, wherein a surface of the dielectric layer structure that is in contact with the conducting layer comprises a higher concentration of nitrogen atoms than oxygen atoms.

19. The method as recited in claim 10, wherein a material of the conducting layer comprises polysilicon.

* * * * *